(12) United States Patent
Goda

(10) Patent No.: US 8,634,252 B2
(45) Date of Patent: Jan. 21, 2014

(54) METHODS OF OPERATING A MEMORY DEVICE HAVING A BURIED BOOSTING PLATE

(75) Inventor: Akira Goda, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/351,148

(22) Filed: Jan. 16, 2012

(65) Prior Publication Data

US 2012/0113713 A1 May 10, 2012

Related U.S. Application Data

(62) Division of application No. 12/402,300, filed on Mar. 11, 2009, now Pat. No. 8,098,529.

(51) Int. Cl.
G11C 11/34 (2006.01)

(52) U.S. Cl.
USPC ............ 365/185.26; 365/185.18; 365/185.29; 365/185.16; 365/185.17; 365/185.27; 365/185.31

(58) Field of Classification Search
USPC ............ 365/185.26, 185.18, 185.29, 185.16, 365/185.17, 185.27, 185.31; 257/315, 257/E29.3
See application file for complete search history.

(56) References Cited

U.S. PATENT DOCUMENTS

| | | | |
|---|---|---|---|
| 5,600,588 A * | 2/1997 | Kawashima | 365/154 |
| 5,610,533 A * | 3/1997 | Arimoto et al. | 326/33 |
| 6,115,287 A | 9/2000 | Shimizu et al. | |
| 7,292,476 B2 | 11/2007 | Goda et al. | |
| 7,408,811 B2 | 8/2008 | Shirota et al. | |
| 7,499,330 B2 | 3/2009 | Goda et al. | |
| 2004/0099878 A1 * | 5/2004 | Huang et al. | 257/170 |
| 2005/0179111 A1 * | 8/2005 | Chao | 257/510 |
| 2006/0278927 A1 | 12/2006 | Park et al. | |
| 2007/0047314 A1 | 3/2007 | Goda et al. | |
| 2007/0047327 A1 | 3/2007 | Goda et al. | |
| 2007/0241369 A1 | 10/2007 | Goda et al. | |
| 2007/0247908 A1 | 10/2007 | Aritome et al. | |
| 2008/0008006 A1 | 1/2008 | Goda et al. | |
| 2008/0019185 A1 * | 1/2008 | Li | 365/185.22 |
| 2008/0037307 A1 | 2/2008 | Goda | |
| 2008/0049494 A1 | 2/2008 | Aritome | |
| 2008/0175060 A1 * | 7/2008 | Liu et al. | 365/185.18 |
| 2008/0273385 A1 | 11/2008 | Goda et al. | |
| 2009/0001442 A1 * | 1/2009 | Ozawa et al. | 257/315 |
| 2009/0059660 A1 * | 3/2009 | Lee et al. | 365/185.02 |
| 2010/0172176 A1 * | 7/2010 | Sommer | 365/185.05 |

OTHER PUBLICATIONS

Park, Han Il et al., "Depletion-Enhanced Body-Isolation (DEBI) Array on SOI for Highly Scalable and Reliable NAND Flash Memories", IEEE Transactions, vol. 5, Issue 3, pp. 201-204, May 2006.

* cited by examiner

Primary Examiner — Fernando Hidalgo
(74) Attorney, Agent, or Firm — Fletcher Yoder

(57) ABSTRACT

Memory devices are disclosed, such as those that include a semiconductor-on-insulator (SOI) NAND memory array having a boosting plate. The boosting plate may be disposed in an insulator layer of the SOI substrate such that the boosting plate exerts a capacitive coupling effect on a p-well of the memory array. Such a boosting plate may be used to boost the p-well during program and erase operations of the memory array. During a read operation, the boosting plate may be grounded to minimize interaction with p-well. Systems including the memory array and methods of operating the memory array are also disclosed.

13 Claims, 12 Drawing Sheets

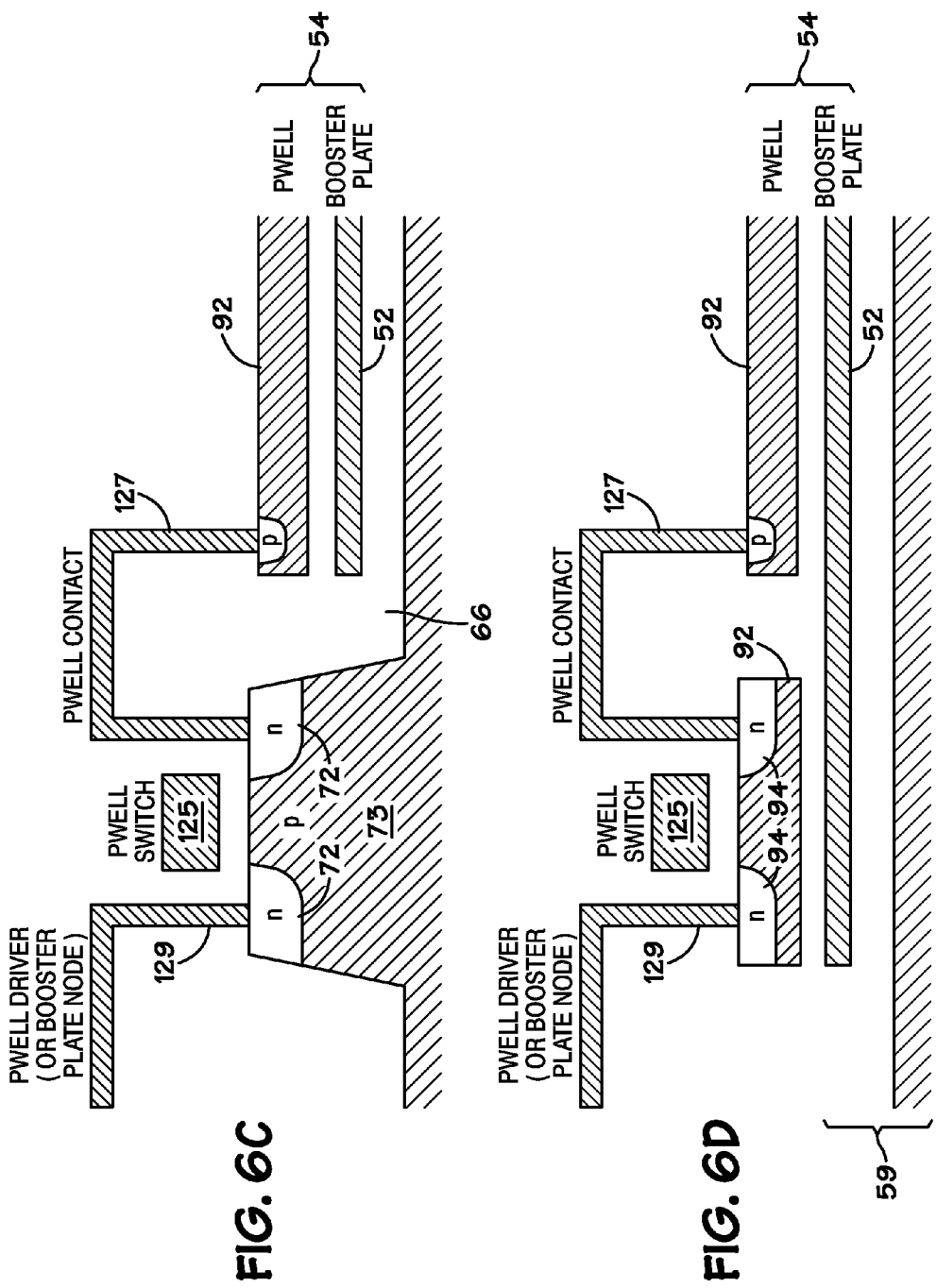

METHODS OF OPERATING A MEMORY DEVICE HAVING A BURIED BOOSTING PLATE

CROSS-REFERENCE TO RELATED APPLICATION

This application is a divisional of U.S. patent application Ser. No. 12/402,300 which was filed on Mar. 11, 2009.

FIELD OF INVENTION

Embodiments of the invention relate generally to memory devices and, in one or more embodiments, more specifically to operation of NAND flash memory devices.

DESCRIPTION OF RELATED ART

Electronic systems, such as computers, personal organizers, cell phones, portable audio players, etc., typically include one or more memory devices to provide storage capability for the system. System memory is generally provided in the form of one or more integrated circuit chips and generally includes both random access memory (RAM) and read-only memory (ROM). System RAM is typically large and volatile and provides the system's main memory. Static RAM and Dynamic RAM are commonly employed types of random access memory. In contrast, system ROM is generally small and includes non-volatile memory for storing initialization routines and identification information.

One type of non-volatile memory that is of particular use is a flash memory. A flash memory can be erased and reprogrammed in blocks. Flash memory is often employed in personal computer systems in order to store the Basic Input Output System (BIOS) program such that it can be easily updated. Flash memory is also employed in portable electronic devices, such as wireless devices, because of the size, durability, and power requirements of flash memory implementations. Various types of flash memory may exist, depending on the arrangement of the individual memory cells and the requirements of the system or device incorporating the flash memory. For example, NAND flash memory is a common implementation of a flash memory device.

A typical flash memory includes a memory array having a large number of memory cells arranged in rows and columns. The memory cells are generally grouped into blocks such that groups of cells can be programmed or erased simultaneously. Each of the memory cells includes a floating gate field-effect transistor or other component capable of holding a charge. Floating gate memory cells differ from standard MOSFET designs in that they include an electrically isolated gate, referred to as the "floating gate," in addition to the standard control gate. The floating gate is generally formed over a channel and separated from the channel by a gate oxide. The control gate is generally formed over the floating gate and is separated from the floating gate by another thin oxide layer. A floating gate memory cell stores information by holding electrical charge within the floating gate. By adding or removing charge from the floating gate, the threshold voltage of the cell changes, thereby defining whether this memory cell is programmed or erased.

The memory array is accessed by a row decoder activating a row of memory cells by selecting an access line, commonly referred to as a wordline, connected to a control gate of a memory cell. In addition, the wordlines connected to the control gates of unselected memory cells of a string of memory cells are driven to operate the unselected memory cells of each string as pass transistors, so that they pass current in a manner that is unrestricted by their stored data values. Current then flows from the source line to a data line, such as a column bit line, through each NAND string via the corresponding select gates, restricted only by the selected memory cells of each string. This places the current-encoded data values of the row of selected memory cells on the column bit lines. To erase the contents of the memory array, a relatively high voltage is applied to the memory array such that the source and drain of the memory cells to be erased are forward biased.

Some smaller memory devices may include memory arrays having memory cells formed on a semiconductor (typically silicon)-on-insulator (SOI) substrate. However, as memory devices become smaller and are fabricated with smaller die sizes, the proximity of the memory cells of a NAND memory array may introduce cross-coupling effects between memory cells, such that operations on a memory cell may affect operation of adjacent memory cells. For example, during a program operation, such an effect may be referred to as "program disturb." In such embodiments, attaining the voltages for a program operation may be difficult without introducing program disturb effects.

BRIEF DESCRIPTION OF DRAWINGS

FIGS. 6A-6D depicts a schematic diagram of a portion of the memory array of FIG. 2 and a p-well switch in accordance with an embodiment of the present invention;

DETAILED DESCRIPTION

Figure 1:
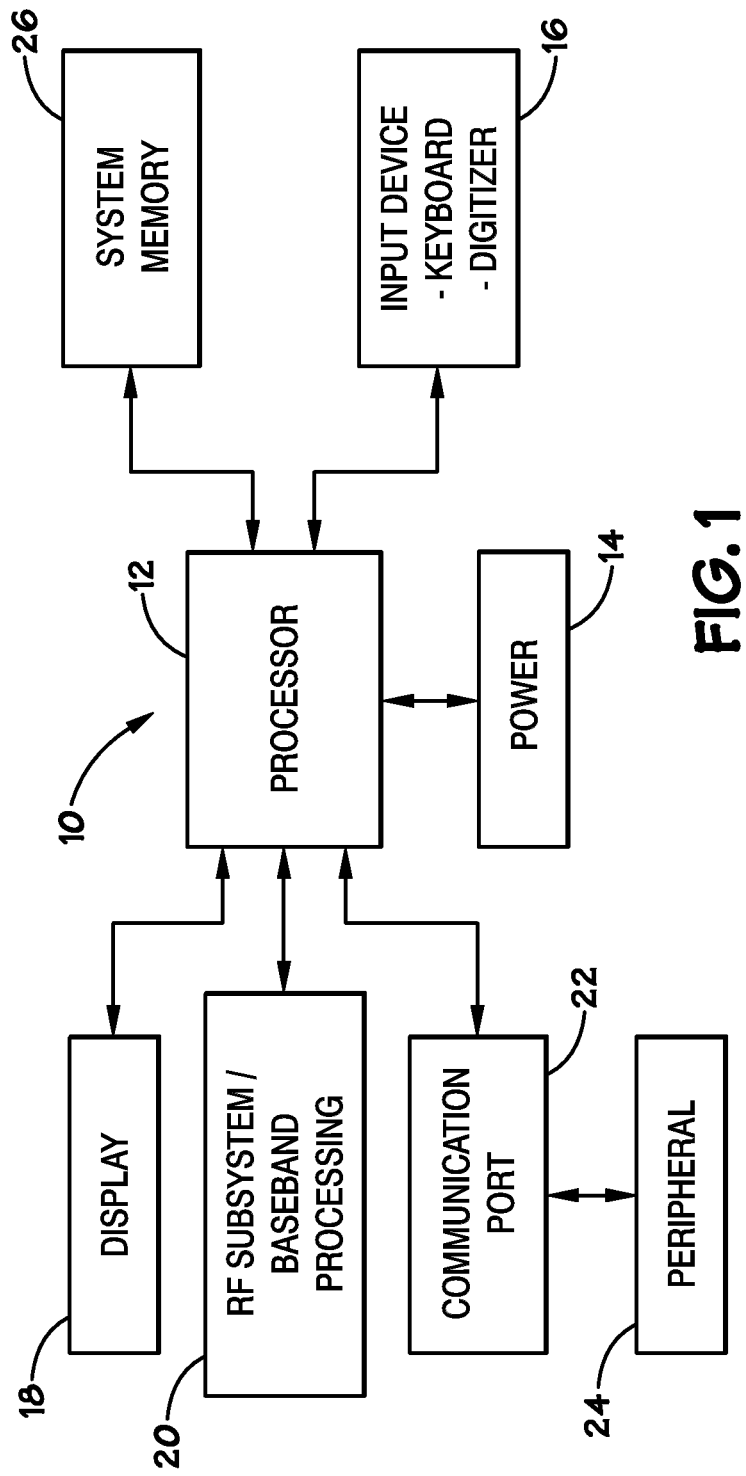
FIG. 1 is a block diagram that illustrates a processor-based device having a memory that includes memory devices fabricated in accordance with one or more embodiments of the present invention.

Turning now to the drawings, and referring initially to FIG. 1, a block diagram depicting an embodiment of a processor-based system, generally designated by reference numeral 10, is illustrated. The system 10 may be any of a variety of types such as a computer, pager, cellular phone, personal organizer, portable audio player, control circuit, camera, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a stylus, a mouse, and/or a voice recognition system, for instance. A display 18 may also be coupled to the processor 12. The display 18 may include an LCD, a CRT, LEDs, and/or an audio display, for example.

Furthermore, an RF sub-system/baseband processor 20 may also be coupled to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, memory is used to enable the processor 12 to be efficient. Generally, the memory is coupled to the processor 12 to store and facilitate execution of various programs. For instance, the processor 12 may be coupled to system memory 26, which may include volatile memory, such as Dynamic Random Access Memory (DRAM) and/or Static Random Access Memory (SRAM). The system memory 26 may also include non-volatile memory, such as read-only memory (ROM), EEPROM, and/or flash memory to be used in conjunction with the volatile memory. As described further below, the system memory 26 may include one or more memory devices, such as flash memory devices, that may include a floating gate memory array fabricated in accordance with embodiments of the present invention.

Figure 2:
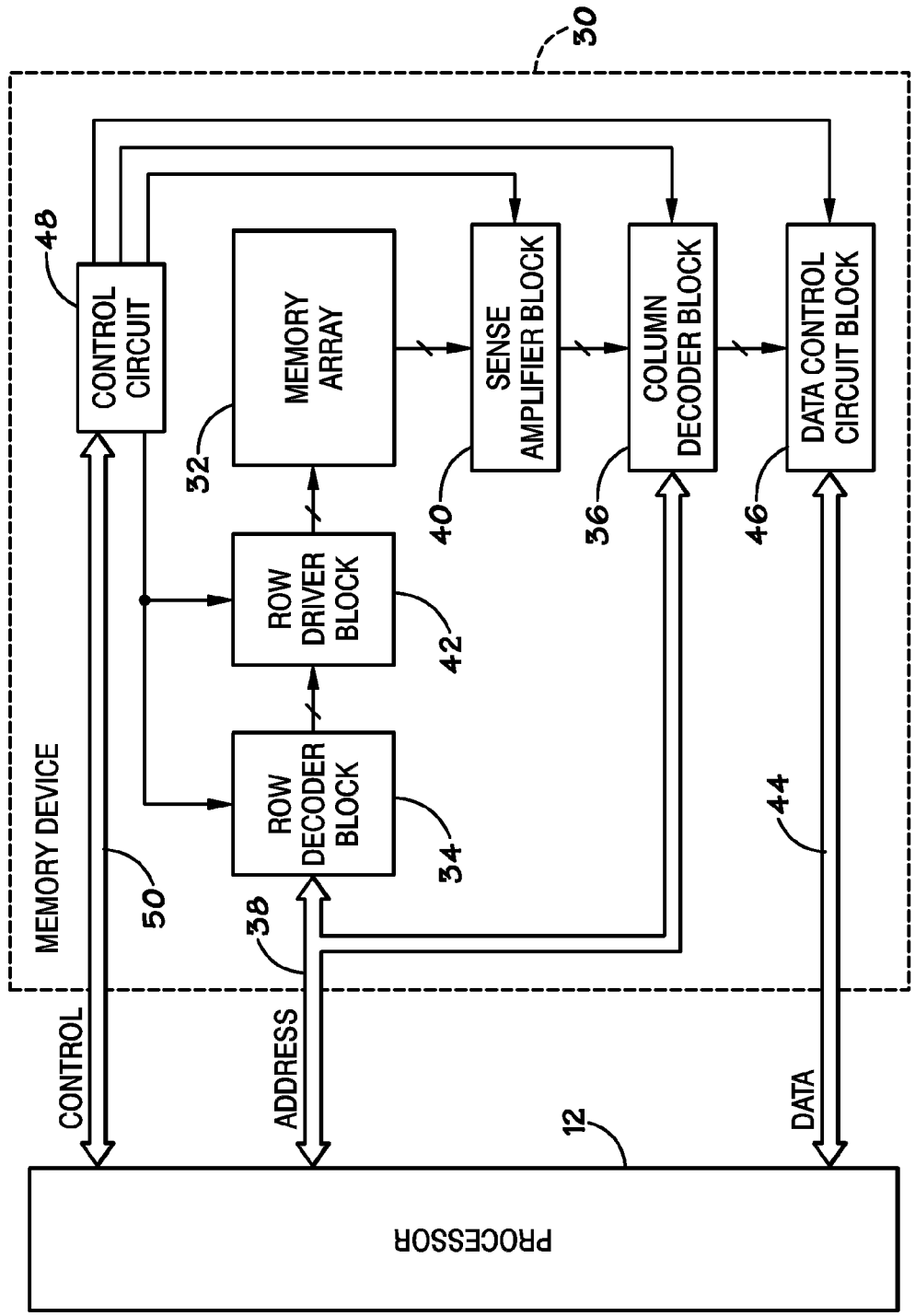
FIG. 2 is a block diagram that illustrates a memory device having a memory array fabricated in accordance with one or more embodiments of the present invention.

FIG. 2 is a block diagram illustrating a memory device, e.g., NAND flash memory device 30, which may be included as a portion of the system memory 26 of FIG. 1. The flash memory device 30 generally includes an SOI memory array 32. The memory array 32 can include many rows and columns of conductive traces logically arranged in a grid pattern to form a number of access lines and data lines. The access lines are used to access cells in the memory array 32, are usually considered the rows or "row lines," and are generally referred to as "wordlines." The data lines are used to sense (e.g., read) the cells, are usually referred to as the columns or "column lines," and are generally referred to as "bit lines" or "digit lines." The size of the memory array 32 (i.e., the number of memory cells) will vary depending on the size of the flash memory device 30.

To access the memory array 32, a row decoder block 34 and a column decoder block 36 are provided and are configured to receive and translate address information from the processor 12 via the address bus 38 to access a particular memory cell in the memory array 32. A sense block, such as sense amplifier block 40 having a plurality of the sense amplifiers, is also provided between the column decoder 36 and the memory array 32 to sense individual data values stored in the memory cells. Further, a row driver block 42 is provided between the row decoder block 34 and the memory array 32 to activate a selected word line in the memory array according to a given row address.

During read and program operations, such as a write operation, data may be transferred to and from the flash memory device 30 via the data bus 44. The coordination of the data and address information may be conducted through a data control circuit block 46. Finally, the flash memory device 30 may include a control circuit 48 configured to receive control signals from the processor 12 via the control bus 50. The control circuit 48 is coupled to each of the row decoder block 34, the column decoder block 36, the sense amplifier block 40, the row driver block 42 and the data control circuit block 46, and is generally configured to coordinate timing and control among the various circuits in the flash memory device 30.

Figure 3:
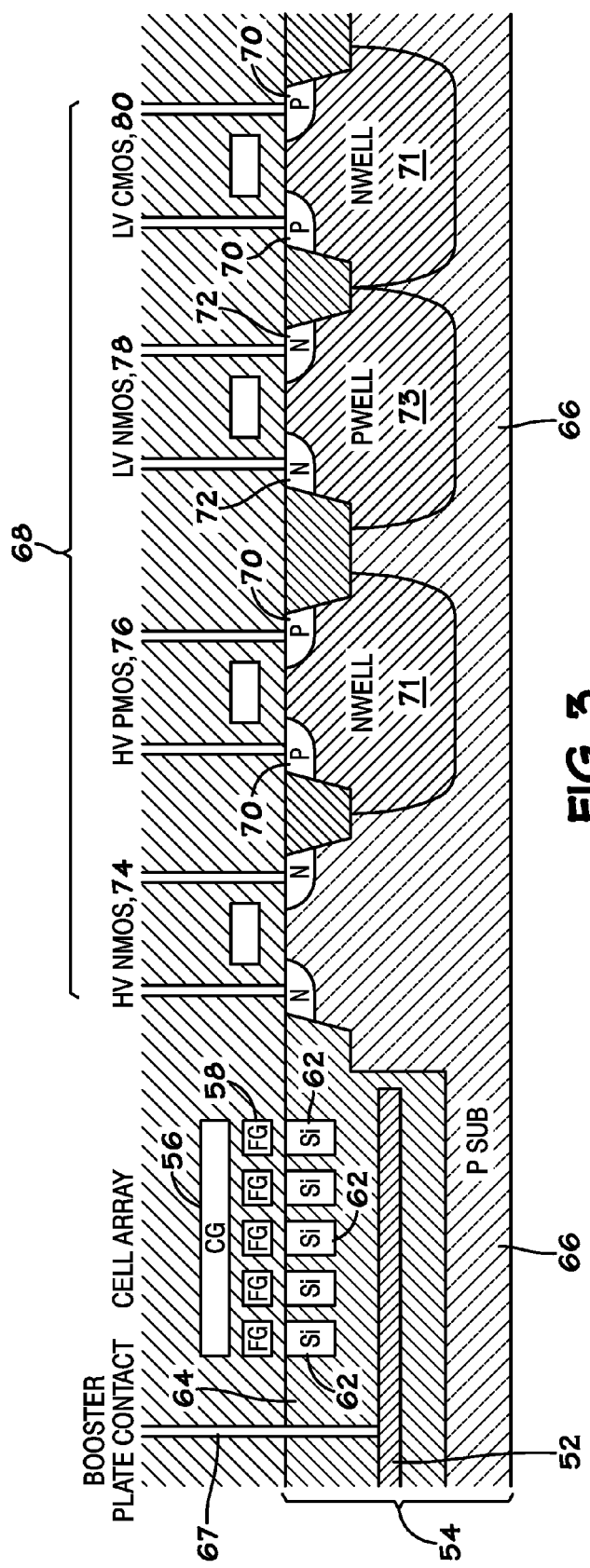
FIG. 3 is a cross-section of a portion of the memory array of FIG. 2 in accordance with an embodiment of the present invention.

FIG. 3 depicts a cross-section of a portion of the SOI NAND memory array 32 and a buried boosting plate 52, in accordance with an embodiment of the present invention. Although the embodiment depicted in FIG. 3 includes NAND memory having floating gates, embodiments of the present invention may include any other memory cell technology with charge storage nodes, e.g., charge trap memory, nano-dot memory, etc. As discussed above, the memory array 32 may be fabricated on a wafer that includes an SOI portion 54 and a bulk silicon portion 66. The memory array 52 includes control gates 56 disposed over a charge storage device (node), e.g., floating gates 58. The floating gates 58 may be separated from the control gates by a dielectric material, such as oxide 60. The control gates 56 and floating gates 58 are disposed over the silicon 62 (which is over the dielectric material that comprises the insulator of the SOI portion 54 of the wafer) to form memory cells of the memory array 32. The SOI portion 54 may include an insulator layer, e.g., a silicon oxide (SiO2) layer 64 (also referred to as a buried oxide (BOX)) disposed over silicon 66. As will be described further, a boosting plate 52, may be formed under the insulator (e.g., it may be a conductive layer buried in the SiO2 layer 64) of the SOI portion 54. The boosting plate 52 may include any conductive material, such as metals, metal alloys, poly Si, etc. In some embodiments, the boosting plate 52 may include tungsten. The boosting plate 52 may be coupled to a boosting plate contact 67 to enable biasing of the boosting plate 52 during operation of the memory array 32 and memory device 30.

The memory device 30 may include a transistor array 68, such as for transferring drive signals to the memory array 32. In one embodiment, as shown in FIG. 3, the transistor array 68 may be disposed on the bulk silicon portion 66, such that the transistor array 68 is not fabricated on the SOI portion 54. The bulk silicon portion 66 may include any number of p-doped regions 70 within n-wells 71 and n-doped regions 72 within p-wells 73 to form the desired transistors of the transistor array 68. The placement of the boosting plate 52 in the SOI portion 54 may reduce or eliminate any effect of the boosting plate 52 on the operation of the transistor array 66. It should be appreciated that any suitable transistor may be formed as part of the transistor array 68. In some embodiments, as shown in FIG. 3, the memory device 32 may include a high voltage (HV) n-channel MOSFET (NMOS) 74, a HV p-channel NMOS 76, a low voltage (LV) NMOS 78, and an LV CMOS 80.

Figure 4:
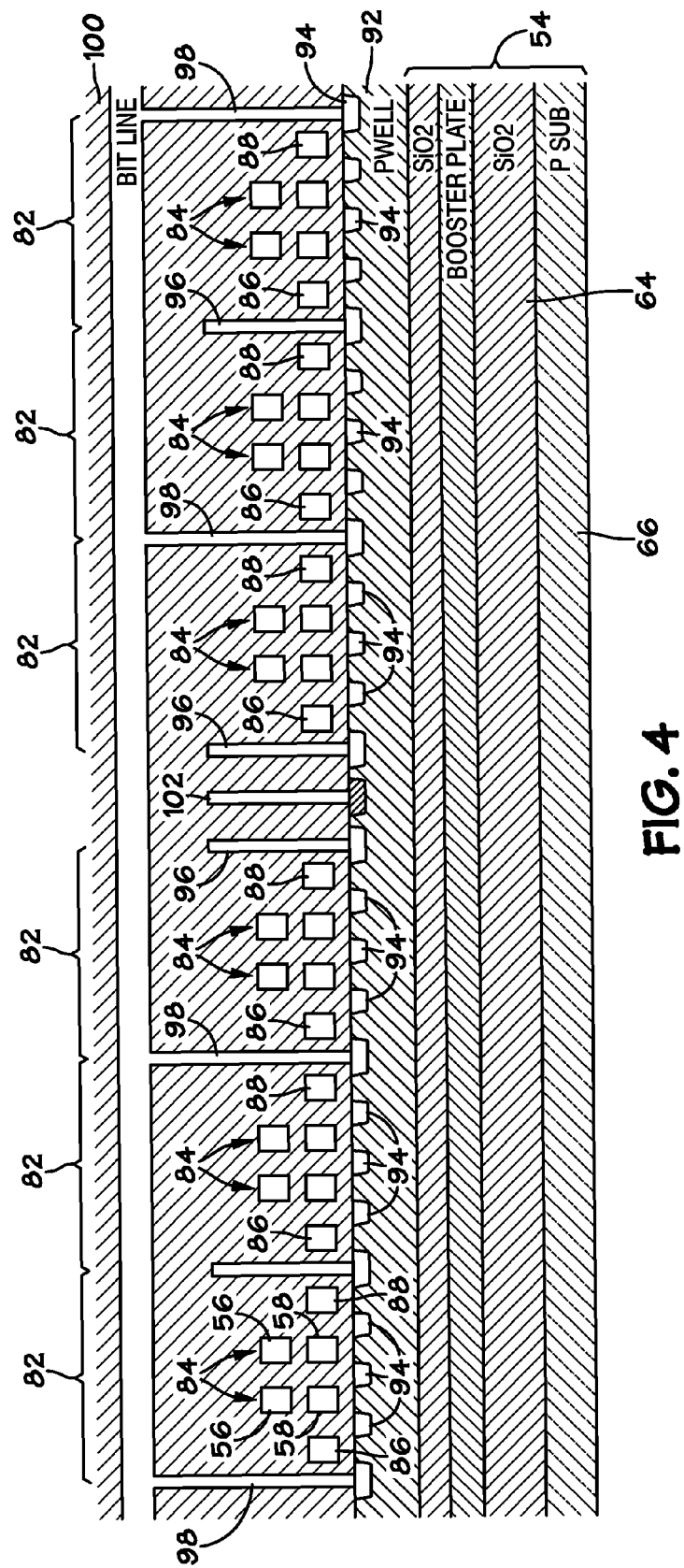
FIG. 4 is another cross-section of a portion of the memory array of FIG. 2 illustrating a plurality of strings of memory cells in accordance with an embodiment of the present invention.

FIG. 4 is another cross-section of a portion of the memory array 32 illustrating a plurality of strings 82 of memory cells 84 in accordance with an embodiment of the present invention. It should be appreciated that each string 82 may include any number of memory cells 84. As mentioned above, each memory cell 84 may be formed from a control gate 56 and a floating gate 58. Each string 82 may include a source select gate transistor 86 and drain select gate transistor 88. The memory cells 84 and select gates 86 and 88 are disposed on a p-well 92 (p-type silicon) having n-doped regions 94 to form the source and drain regions for the memory cells 84 and the select gates 86 and 88. The plurality of strings 82 may include a plurality of common source contacts 96 and bitline contacts 98. The p-well 92 and n-doped regions 94 may couple to a bitline 100 for the memory cells 84 through the bitline contacts 98, and a wordline (not shown) may be coupled to each control gate 56. Additionally, the p-well 92 may be biased through the p-well contact 102.

As shown in FIG. 4, the boosting plate 52 is disposed in the SOI portion 54 such that the boosting plate 52 is disposed under the memory cells 84 of the strings 88. Due to the disposition of the boosting plate 52 in the SOI portion 54 such that the p-well 92 and boosting plate 52 are separated by the SiO2 layer 64, the boosting plate 52 is in capacitive contact with the p-well 92. That is, biasing the boosting plate 52 may exert a capacitive coupling effect on the p-well 92 such that the p-well 92 may be influenced by the voltage on the boosting plate 52. For example, if the p-well 92 is floating, the p-well may couple up to a voltage if the boosting plate 52 is biased to a voltage. As explained further below, this capacitive coupling effect may be used to affect the p-well 92 during program and erase operations of the memory cells 84. It should be appreciated that a boosting plate may be any size, shape, or topography suitable for achieving the desired capacitive coupling effect with the p-well 92

Figure 5:
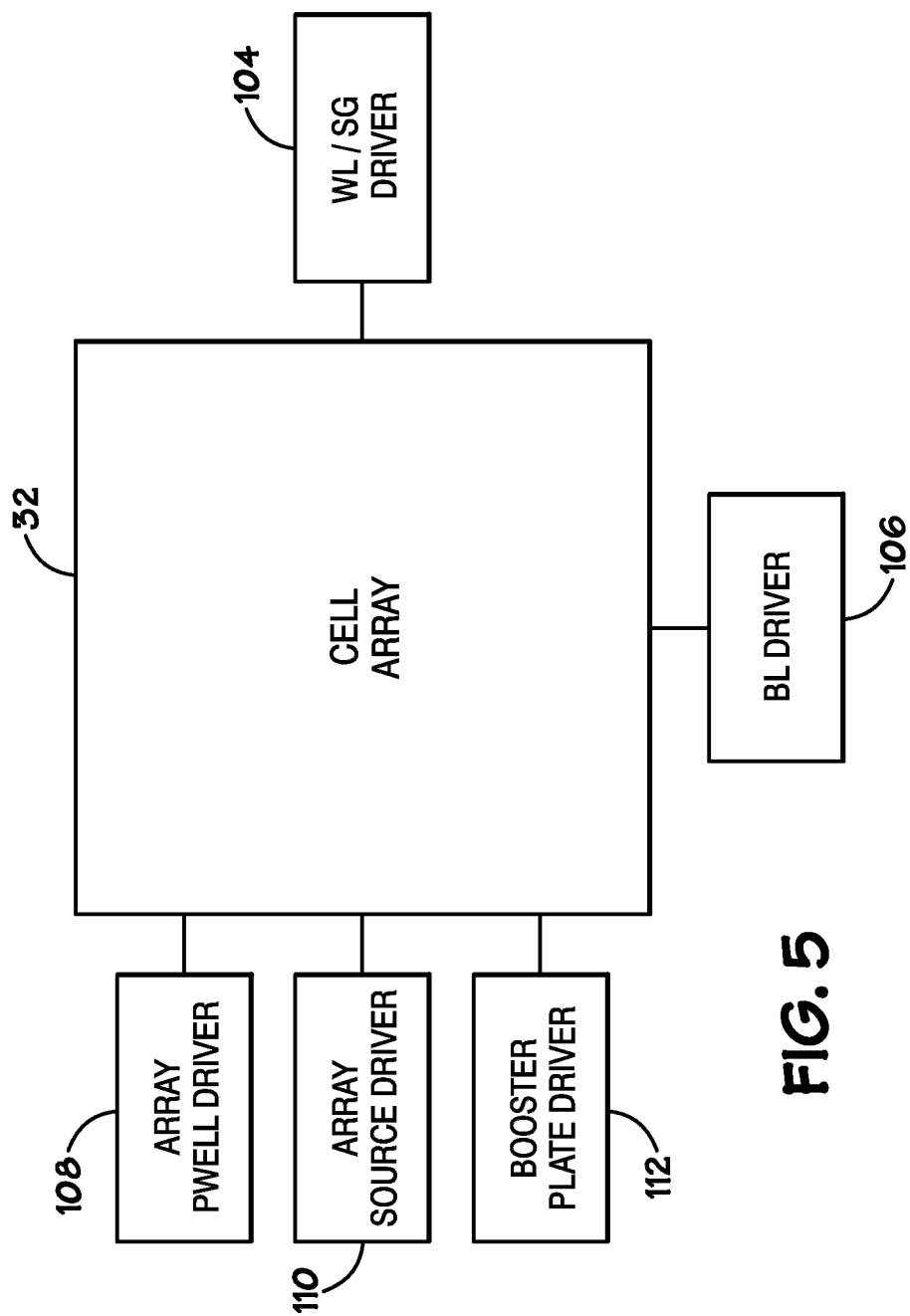
FIG. 5 depicts a block diagram of the memory array of FIG. 2 and drivers that may be used to operate the memory array in accordance with an embodiment of the present invention.

FIG. 5 depicts a block diagram of the SOI memory array 32 and drivers that may be used to operate the memory array 32 in accordance with an embodiment of the present invention. The memory array 32 may be coupled to a wordline and select gate driver 104 and a bitline driver 106 to bias the wordlines and bitlines respectively during program, erase, read, and other operations. An array p-well driver 108 may be coupled to the p-well contact 102, and an array source bias 110 may be coupled to the common source contacts 96. The boosting plate may be independently controlled through a boosting plate driver 112 coupled to the boosting plate 52 via the boosting plate contact 66.

Figure 6A:
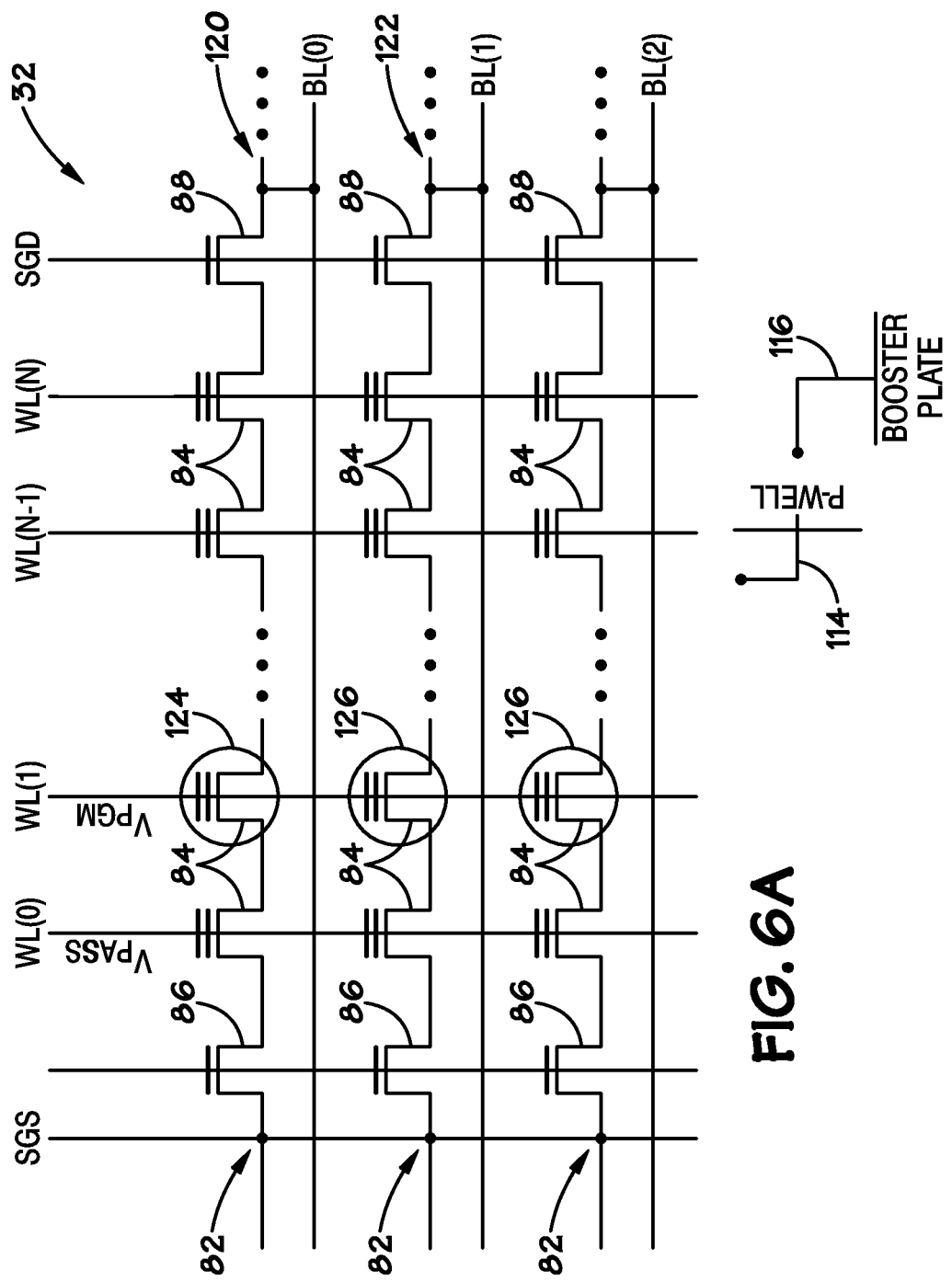
Figure 6B:
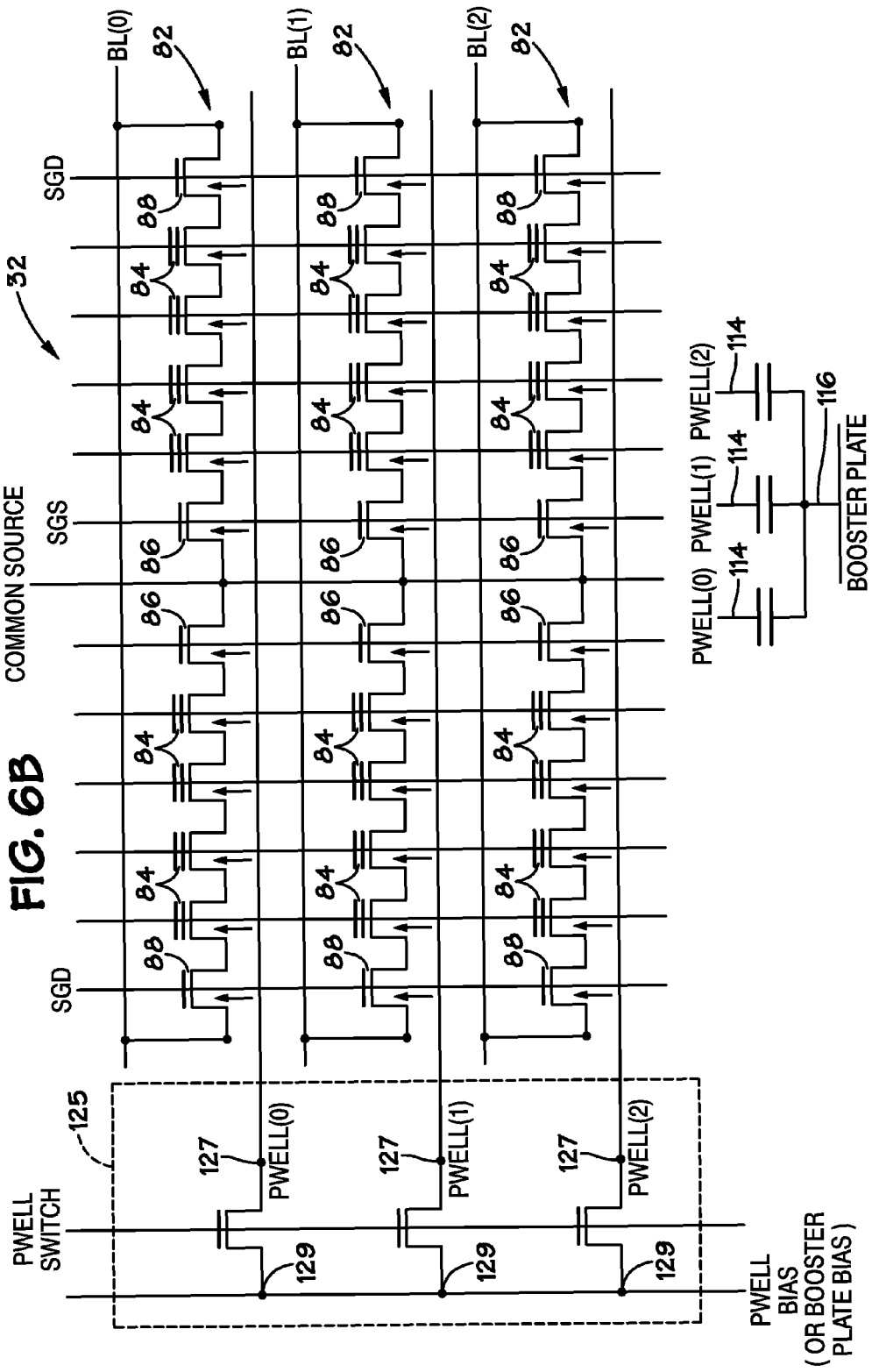

Turning now to operation of the memory array 32, FIG. 6A depicts a schematic diagram of a portion of the memory array 32 in accordance with an embodiment of the present invention. Additionally, FIGS. 6B-6D depict p-well switching capability of the memory array 32, which may be used to aid operation of the boosting plate 52 in accordance with another embodiment of the present invention. As discussed above, the memory array 32 may include a plurality of strings 82 comprising a plurality of memory cells 84. A string 82 may include any number of memory cells 84 to store any number of units of data, such as any number of bits, bytes, etc. The NAND memory array 32 includes local word lines WL(0)-WL(N) and intersecting local bit lines BL(0)-BL(2). A connection 114 to a p-well 92 of the strings is shown. As discussed above, a boosting plate connection 116 is shown coupled to the p-well 92, indicating the capacitive coupling effect of the boosting plate 52.

The NAND memory array 32 includes the memory cells 84 located at each intersection of a local word line (WL) and a local bit line (BL). As will be appreciated, each memory cell 84 includes a source, a drain, a floating gate, and a control gate. The control gate of each memory cell 84 is coupled to (and in at least some cases form) a respective local word line (WL). The memory cells 84 are connected in series, source to drain, to form the NAND string 82 formed between select gates. Specifically, the strings 82 are formed between the local drain select gates 88 and the source select gate 86. A local drain select line (SGD) is coupled to a respective drain select gate 88. Similarly, the local source select line (SGS) is coupled to each NAND string 82 through the source select gate 86. A "column" of the memory array 32 includes a NAND string 82 and the source select gate 86 and drain select gate 88 connected thereto. A "row" of the memory cells 84 are those transistors commonly coupled to a given local access line, such as a local word line (WL).

As mentioned above and as described further below, during some operations of the memory array 32, such as a program operation, cross-coupling effects may occur on adjacent memory cells. One such example may include a "program disturb" effect between memory cells of a programmed string (e.g., a string containing the memory cell or cells being programmed) and memory cells of an inhibited string (e.g., the string not being programmed). The program disturb effect may be described with reference to FIG. 6 and a programmed string 120 and an inhibited string 122. During program of a memory cell 124, the wordline WL(1) coupled to the memory cell 124 may be biased to a program voltage (Vpgm). The wordlines WL(0) and other wordlines in the programmed string 120 may be biased to a pass voltage Vpass. The bitline BL(0) coupled to the programmed string 120 may be biased to 0V, and the bitline BL(1) coupled to the inhibited string 122 may be floating or biased to Vcc. During the program, a memory cell 126 that is coupled to the wordline WL(1) may experience a program disturb, e.g., charge may become trapped in the floating gate of the memory cell 126 from the channel due to the voltage difference between the channel and the wordline WL(1). As described further below, during a program, the boosting plate 52 may be biased to a certain voltage to influence the voltage of the p-well 92 (FIG. 4) for both the programmed string 120 and inhibited string 122.

Referring now to FIGS. 6B, 6C, and 6D, the memory array 32 may include a p-well switch 125 coupled to a first p-well P-well(0), a second p-well P-well(1), and a third p-well P-well(2) in accordance with an embodiment of the present invention. Each p-well P-well(0), P-well(1), and P-well(2) has individual p-well contacts 127 coupled to the p-well switch 125. Additionally, the p-well switch 125 includes individual contacts 129 that each may be coupled to a voltage source, e.g., the p-well driver 108 or a node of the boosting plate 52.

The p-well switch 125 enables each p-well to have individual voltages during operation of the memory array 32. During a programming operation, the p-well switch 125 may be "OFF" such that each p-well P-well(0), P-well(1), and P-well(2) are floating. During such a programming operation, the individual p-well contacts 127 allow each p-well to have individual voltages.

During an erase operation, the p-well switch may be "ON", allowing the p-wells P-well(0), P-well(1), and P-well(2) to be biased. Similarly, during a read operation, the p-well switch may "ON", allowing the p-wells to be biased. Thus, during an erase or read operation each p-well node of P-well(0), P-well (1), and P-well(2) may be biased at common voltages through the p-well switch 125. As shown in FIG. 6C, in some embodiments the P-well switch 125 may be formed over the silicon 66, similar to transistor array 68. In other embodiments, as shown in FIG. 6D, the p-well switch 125 may be formed over the SOI portion 54 as part of the memory array 32.

Figure 7A:
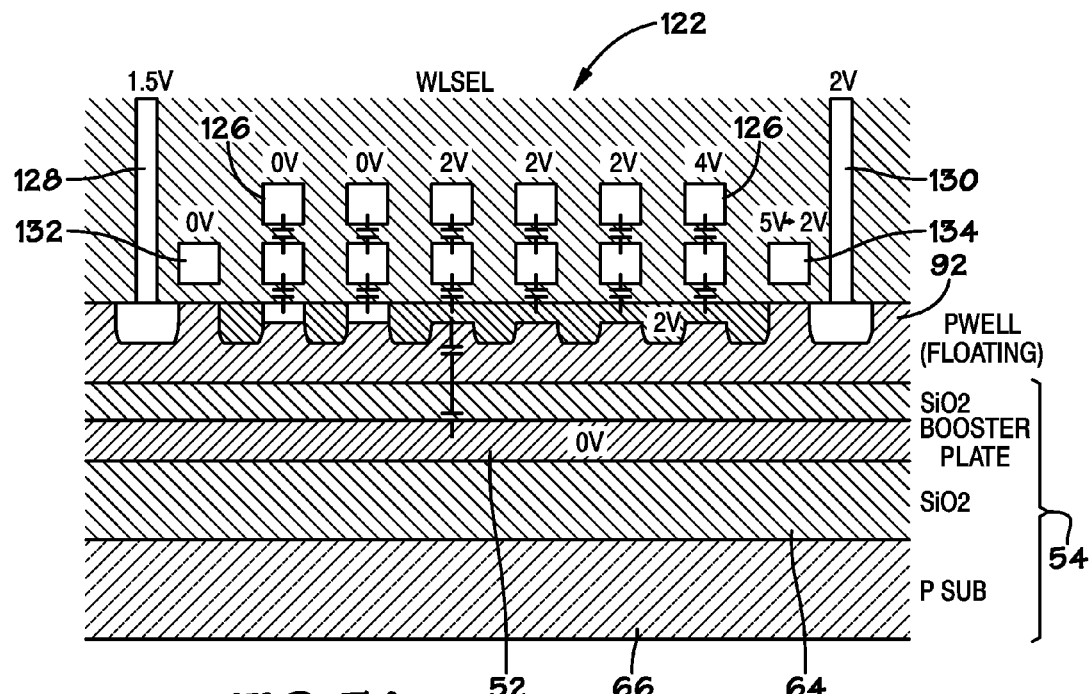
FIGS. 7A and 7B depict a cross-section of an inhibited string and programmed string of the memory array during a first step of a program operation in accordance with an embodiment of the present invention.
Figure 7B:
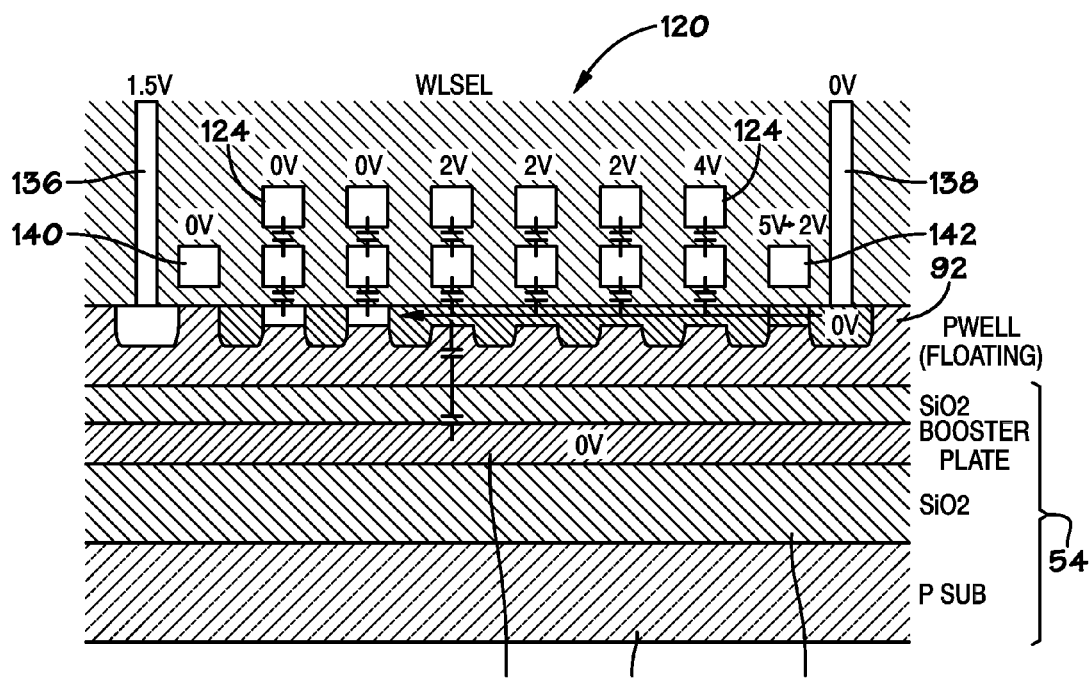

FIGS. 7A and 7B depict a cross-section of the inhibited string 122 and programmed string 120 of the memory array 32 during programming of a memory cell in accordance with an embodiment of the present invention. As described above, the memory array 32 is fabricated on the SOI portion 54 having the SiO2 layer 64 and silicon 66. FIG. 7A depicts a cross-section of the inhibited string 122, e.g., those memory cells not being programmed and includes a common source contact 128, a bitline contact 130, and select gates 132 and 134. FIG. 7B depicts a cross-section of the programmed string 120, e.g., the string including those memory cells being programmed. FIG. 7B includes a common source contact 136, a bitline contact 138, and select gates 140 and 142.

As shown in FIGS. 7A and 7B, in a first step of the programming operation, the boosting plate 52 may be biased to about 0V. As shown in FIG. 7A, the bitline coupled to bitline contact 130 of the inhibited string 122 is biased to about 2V, and as shown in FIG. 7B, the bitline coupled to the bitline contact 138 of the programmed string 120 is biased to about 0V. The source select gate 132 of the inhibited string 122 and the source select gate 140 of the programmed string 120 may be biased to about 0V via the source gate select line (SGS). The drain select gates 134 and 142 of the inhibited string 122 and programmed string 120 may be biased to about 2V via the drain select line (SGD). The p-well 92 is floating and may experience minimal capacitive coupling effects from the boosting plate 52.

Figure 8A:
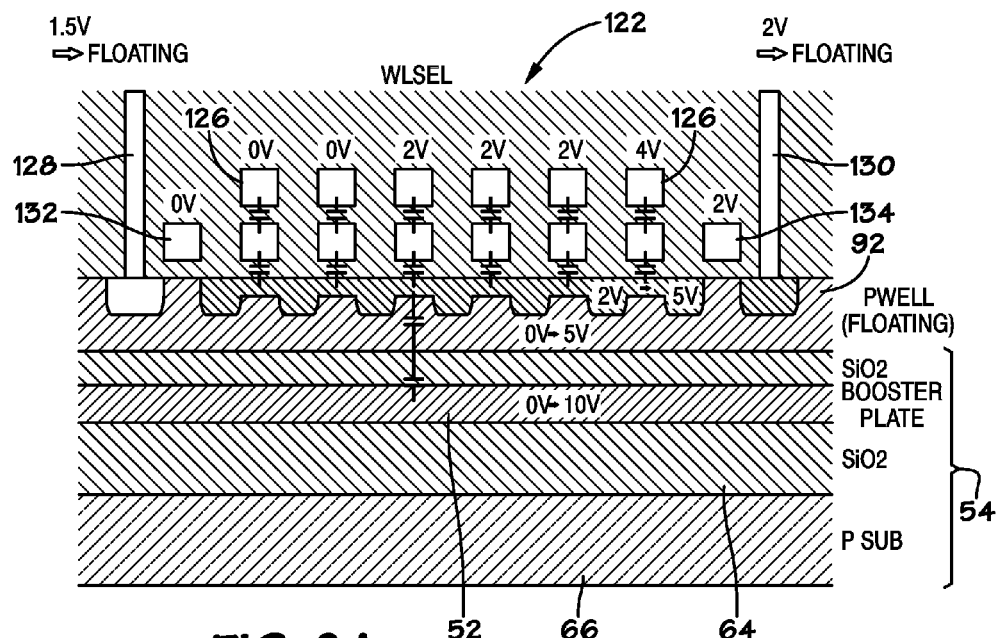
FIGS. 8A and 8B depict a cross-section of an inhibited string and programmed string of the memory array during a second step of a program operation in accordance with an embodiment of the present invention.
Figure 8B:
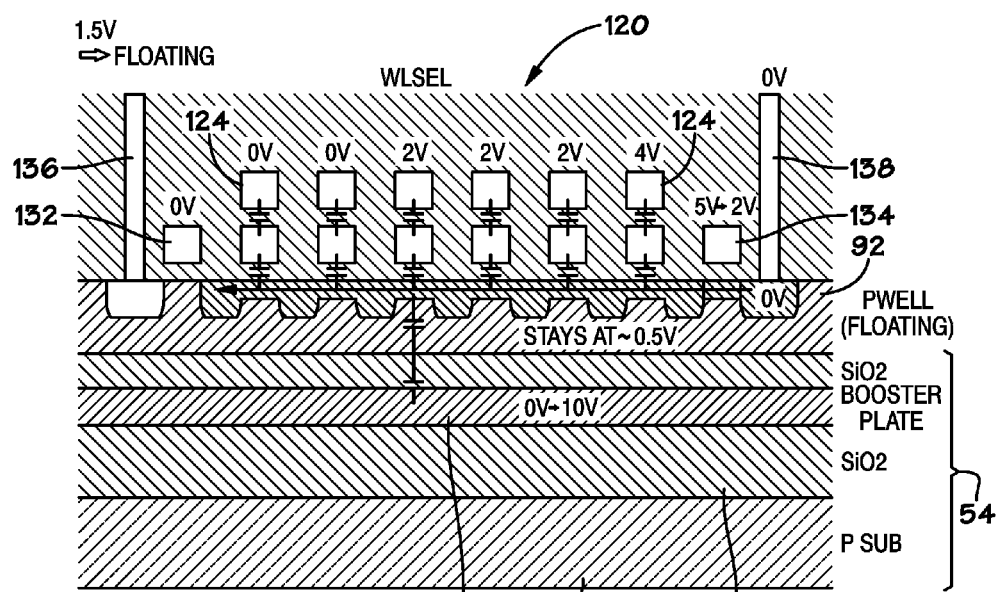

FIGS. 8A and 8B depict a cross-section of the inhibited string 122 and programmed string 120 during a second step of the programming operation in accordance with an embodiment of the present invention. As shown in FIGS. 8A and 8B, the boosting plate 52 may be biased to a voltage, Vboost. In one embodiment, Vboost may be about 10V. The bitline coupled to bitline contact 130 and the common source 128 of the inhibited string 122 may be floating, enabling the p-well 92 to respond to the biased boosting plate 52. As discussed above, the capacitive coupling effect between the boosting plate 52 and the p-well 92 causes the p-well 92 to couple up to some voltage less than Vboost. For example, as shown in FIG. 8A, for a Vboost of about 10V, the p-well 92 may couple up to about 5V.

The bitline coupled to bitline contact 138 of the programmed string may remain biased at about 0V. In such an embodiment, biasing of the boosting plate 52 to Vboost may only minimally affect the p-well 92. For example, as shown in FIG. 8B, biasing the boosting plate 52 to about 10V results in a p-well voltage of about 0.5V in the programmed string 120.

Figure 9A:
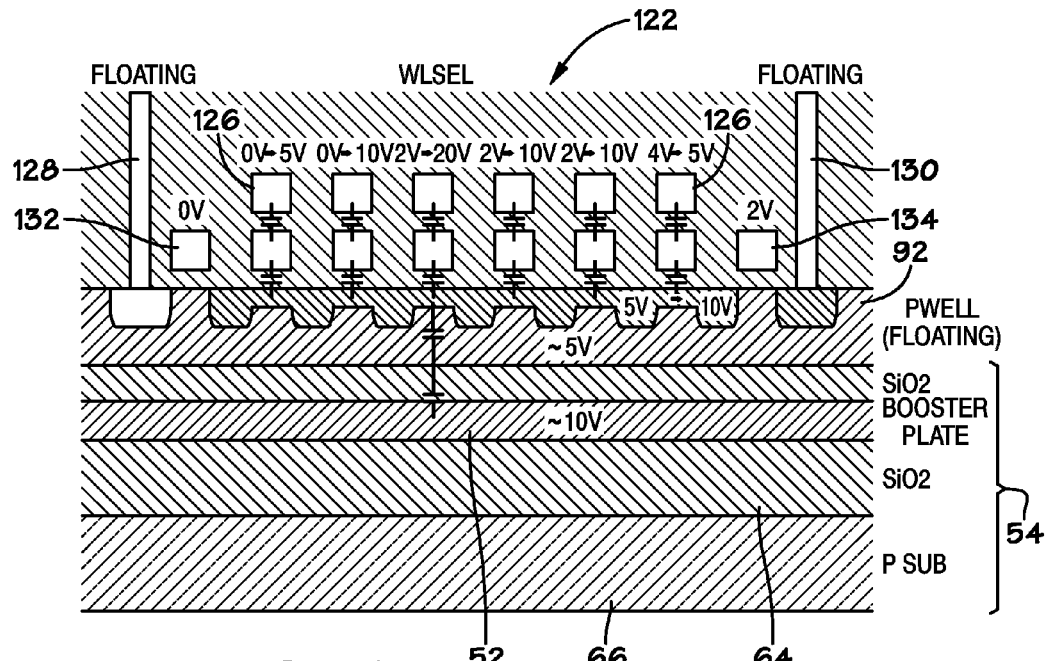
FIGS. 9A and 9B depict a cross-section of an inhibited string and programmed string of the memory array during a third step of a program operation in accordance with an embodiment of the present invention.
Figure 9B:
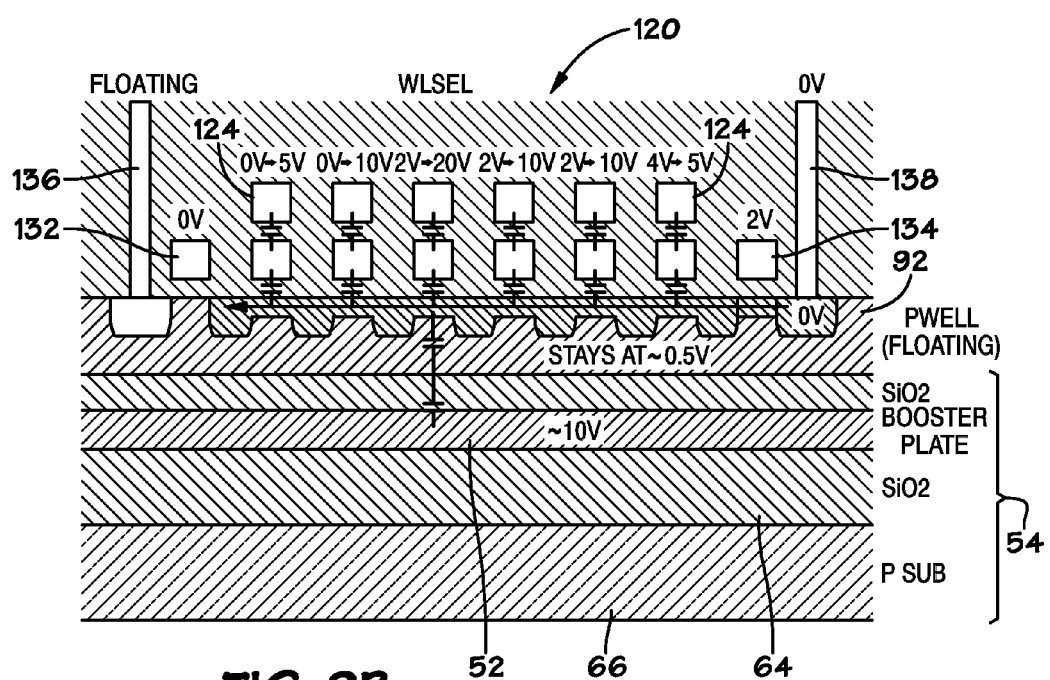

FIGS. 9A and 9B depict a cross-section of the inhibited string 122 and programmed string 120 during a third program step in accordance with an operation of the present invention. To program the memory cell 124 of the programmed string 120, the wordline (WL_sel) coupled to the memory cell 124 may be biased to a program voltage, Vpgm, such as about 20V as shown in FIG. 9B. Thus, the memory cell 126 of the inhibited string 122 is also experiencing the voltage Vpgm of the wordline (WL_sel). The wordlines adjacent to the programmed memory cell (WL_unsel) may be biased to a pass-through voltage (Vpass, also referred as an inhibited voltage Vinh), such as 10V, 5V, etc., as shown in FIGS. 9A and 9B.

As clearly seen in FIGS. 9A and 9B, the resulting difference in voltage between the p-well 92 of the inhibited string 122 (about 5V) and the p-well 92 of the programmed string 120 (about 0.5V) influences the behavior of the memory cells 124 and 126 coupled to the selected wordline. As shown in FIG. 9A, the voltage difference between the selected wordline and the channel on the p-well 92 may be low enough to minimize or eliminate any program disturb. For example, at a Vpgm of about 20V on the selected wordline, a p-well voltage of about 5V, and channel voltage of about 10V, the difference in voltage may minimize or eliminate any flow of charge from the channel into the floating gate of the memory cell 126.

As shown in FIG. 9B, the voltage difference between the selected wordline and the boosted p-well 92 may be large enough to allow normal programming of the memory cell 124. For example, the floated p-well voltage of the programmed string may about 0.5V, and the selected wordline may be biased to a Vpgm of about 20V, thus allowing charge from the channel to become trapped in the floating gate of the programmed memory cell 124. In this manner the boosting plate 52 may affect the p-well such that the p-well of both an inhibited string and a programmed string is optimized to reduce or eliminate program disturb and allow programming of any memory cells of the programmed string.

The voltages applied to the lines, p-well, and boosting plate of the programmed string and the inhibited string during a program operation according to at least one embodiment of this invention are summarized below in Table 1:

TABLE 1

|  | Pgm |
| --- | --- |
| WL_sel | Vpgm |
| WL_unsel | Vpass (Vinh) |
| SGS | Vsgs |
| SGD | Vsgd |
| BL_sel | Vbl_sel |
| BL_unsel | Vbl_unsel -> floating |
| Common source | Vsource -> floating |
| P-well | Floating |
| Boosting plate | Vboost |
| P-well switch | OFF |

In some embodiments, the boosting plate 52 may be used during an erase operation of a block of memory cells of the memory array 32. In a conventional erase operation, the p-well 92 is biased to an erase voltage Verase, such that charge flows out of the floating gate of the erased memory cells. However, in a conventional erase operation, there may be some delay associated with biasing the p-well (also referred to as p-well resistive/capacitive (RC) delay). In some embodiments, the boosting plate 52 may be used to reduce this RC delay of the p-well 92 and reduce the time for execution of the erase operation.

Figure 10:
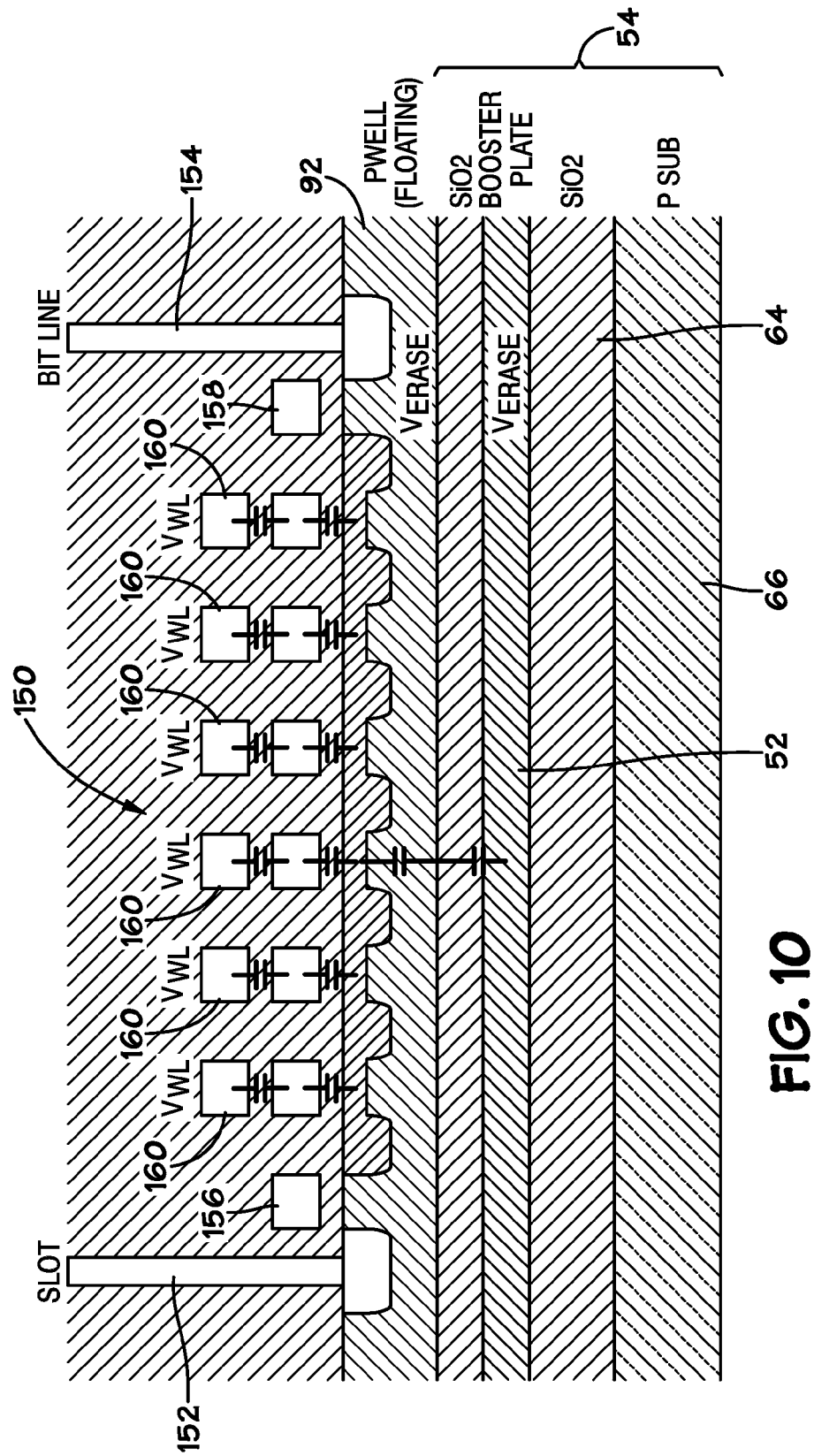
FIG. 10 depicts a cross section of a string of the memory array during an erase operation in accordance with an embodiment of the present invention.

FIG. 10 depicts a cross section of a string 150 of the memory array 32 during an erase in accordance with an embodiment of the present invention. As described above, the string 150 is fabricated on the SOI portion 54 having the SiO2 layer 64 and silicon substrate 66. The string includes a common source contact 152, a bitline contact 154, select gates 156 and 158, and memory cells 160.

As shown in FIG. 6, the wordlines of the erased string may be biased to an erase voltage Vwl. The source select gate 156, drain select gate 158, common source coupled to common contact 152 and bitline coupled to bitline contact 154 of the erased string are floating. To reduce RC delay of the p-well 92 and speed up the erase operation, the boosting plate 52 may be biased to an erase voltage (Verase). As the p-well 92 is also biased to Verase (such as by turning on the p-well switch 125), biasing the boosting plate before the erase allows the capacitive coupling effect between the boosting plate 52 and p-well 92 to aid coupling the p-well 92 to Verase. In other embodiments, the boosting plate 52 may be biased to any suitable voltage to capacitive couple the p-well to the desired erase voltage (Verase), such as about 10V. For an erase of the memory cells 160 of a string of the memory array 32, the voltages applied to the lines, p-well 92, and boosting plate 52 of the erased string are summarized below in Table 2:

TABLE 2

| | Erase |
|---|---|
| WL | Vwl |
| BL | Floating |
| SGS | Floating |
| SGD | Floating |
| Common source | Floating |
| P-well | Verase |
| Boosting plate | 10 V or Verase |
| P-well switch | ON |

For a read operation of the memory array 32, the boosting plate 52 may be grounded to eliminate any effect of the boosting plate 52 on the p-well 92. For a read of the memory array 32, the voltages applied to the lines, p-well, and boosting plate of are summarized below in Table 3:

TABLE 3

| | Read |
|---|---|
| WL_sel | Vref |
| WL_unsel | Vread |
| SGS | Vsgs |
| SGD | Vsgd |
| BL_sel | Vbl_sel |
| BL_unsel | 0 V |
| Common source | GND |
| P-well | GND |
| Boosting plate | GND |
| P-well switch | ON |

What is claimed is:

1. A method of operating a memory device, the memory device comprising a charge-trap memory array, the memory array comprising at least one memory cell, the at least one memory cell being on a semiconductor material, the semiconductor material being over a dielectric material, the method comprising:
biasing a boosting plate under the dielectric material to a non-ground voltage level during an operation of the memory cell.

2. The method of claim 1, wherein the operation comprises erasing the memory array and biasing the boosting plate comprises biasing the boosting plate to an erase voltage as the non-ground voltage level.

3. The method of claim 1, wherein biasing the boosting plate under the dielectric material comprises exerting a capacitive coupling effect on the semiconductor material.

4. A method of operating a memory cell on a semiconductor material, the semiconductor material being over a dielectric material, the method comprising:
biasing a boosting plate under the dielectric material to a non-ground voltage level during the operating of the memory cell, such that the boosting plate exerts a capacitive coupling effect on the semiconductor material.

5. The method of claim 4, wherein operating comprises erasing the memory cell.

6. A method of claim 5, wherein erasing comprises biasing a boosting plate under the dielectric material during the erasing, such that the boosting plate exerts a capacitive coupling effect on the semiconductor material.

7. The method of claim 6, comprising biasing the semiconductor material.

8. The method of claim 7, comprising biasing the boosting plate to a voltage to capacitively couple the semiconductor material to a desired erase voltage.

9. The method of claim 8, where the boosting plate and semiconductor material are coupled to the same voltage and the boosting plate is biased before the semiconductor material is biased.

10. The method of claim 9, comprising floating a data line coupled to the memory cell.

11. The method of claim 9, comprising floating a source select gate, drain select gate and source coupled to a string including the cell being erased, and biasing access lines coupled to cells of the string to an access line erase voltage.

12. A method of operating a memory cell on a semiconductor material, the semiconductor material being over a dielectric material, the method comprising
driving a boosting plate disposed in the dielectric material under the semiconductor material to a non-ground voltage level during the operating of the memory cell.

13. The method of claim 12, wherein driving the boosting plate comprises exerting a capacitive coupling effect on the semiconductor material.

\* \* \* \* \*